United States Patent
Lefaudex et al.

(10) Patent No.: US 12,136,685 B2
(45) Date of Patent: Nov. 5, 2024

(54) PROCESS FOR MOUNTING A MATRIX-ARRAY ELECTROLUMINESCENT COMPONENT ON A CARRIER

(71) Applicant: VALEO VISION, Bobigny (FR)

(72) Inventors: Nicolas Lefaudex, Bobigny (FR); Antoine De Lamberterie, Bobigny (FR); Guillaume Thin, Bobigny (FR); Samira Mbata, Bobigny (FR); Thomas Canonne, Bobigny (FR); Van Thai Hoang, Bobigny (FR); Vincent Dubois, Bobigny (FR); Francois-Xavier Amiel, Bobigny (FR)

(73) Assignee: VALEO VISION, Bobigny (FR)

( * ) Notice: Subject to any disclaimer, the term of this patent is extended or adjusted under 35 U.S.C. 154(b) by 799 days.

(21) Appl. No.: 16/333,923

(22) PCT Filed: Jul. 26, 2017

(86) PCT No.: PCT/EP2017/068936
§ 371 (c)(1),
(2) Date: Mar. 15, 2019

(87) PCT Pub. No.: WO2018/050339
PCT Pub. Date: Mar. 22, 2018

(65) Prior Publication Data
US 2019/0207056 A1  Jul. 4, 2019

(30) Foreign Application Priority Data
Sep. 15, 2016  (FR) .................................... 1658628

(51) Int. Cl.
*H01L 27/15* (2006.01)
*F21S 43/14* (2018.01)
(Continued)

(52) U.S. Cl.
CPC .......... *H01L 33/0093* (2020.05); *F21S 43/14* (2018.01); *F21S 43/195* (2018.01);
(Continued)

(58) Field of Classification Search
CPC ..... H01L 33/0093; H01L 24/05; H01L 24/80; H01L 24/94; H01L 27/156; F21S 43/14; F21S 43/195
(Continued)

(56) References Cited

U.S. PATENT DOCUMENTS 5,610,413 A * 3/1997 Fan .................. H01L 21/02395
257/97
7,179,719 B2 * 2/2007 Droes ............... H01L 21/76254
257/E21.567
(Continued)

FOREIGN PATENT DOCUMENTS

DE   10 2011 056 888 A1   6/2013
KR   10-2014-0138455 A   12/2014
(Continued)

OTHER PUBLICATIONS

Combined Chinese Office Action and Search Report issued Dec. 3, 2020, in Chinese Patent Application No. 201780056989.X (with English translation), 11 pages.
(Continued)

*Primary Examiner* — Ori Nadav
(74) *Attorney, Agent, or Firm* — Oblon, McClelland, Maier & Neustadt, L.L.P.

(57) ABSTRACT

A process for mounting a light component on a carrier. The light component includes a generally planar substrate, on a first face of which submillimetre-sized electroluminescent semiconductor elements are epitaxied in the form of a matrix. The process is noteworthy in that it eliminates the need for a layer of filler material between the component and
(Continued)

Figure 1:
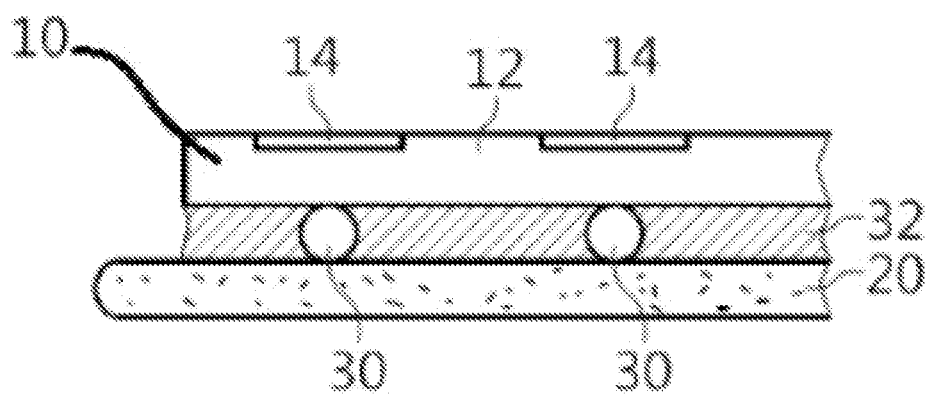

the carrier, while providing good thermal and electrical conductivity between the component and the carrier and high mechanical strength.

14 Claims, 2 Drawing Sheets

(51) Int. Cl.
- *F21S 43/19* (2018.01)
- *H01L 23/00* (2006.01)
- *H01L 33/00* (2010.01)
- *H01L 25/16* (2023.01)

(52) U.S. Cl.
CPC ............. *H01L 24/05* (2013.01); *H01L 24/80* (2013.01); *H01L 24/94* (2013.01); *H01L 27/156* (2013.01); *H01L 25/167* (2013.01); *H01L 2224/05571* (2013.01); *H01L 2224/05647* (2013.01)

(58) Field of Classification Search
USPC ......................................................... 257/77
See application file for complete search history.

(56) References Cited

U.S. PATENT DOCUMENTS

| | | | | |
|---|---|---|---|---|
| 2001/0001735 A1* | 5/2001 | Chu | ...................... | H01L 23/544 |
| | | | | 438/690 |
| 2004/0018702 A1* | 1/2004 | Ito | ...................... | H01L 29/6659 |
| | | | | 257/E21.349 |
| 2012/0223875 A1 | 9/2012 | Lau et al. | | |
| 2014/0061915 A1* | 3/2014 | Collins | ................... | H01L 24/94 |
| | | | | 257/E23.161 |
| 2014/0091993 A1 | 4/2014 | Lau et al. | | |
| 2015/0014716 A1* | 1/2015 | von Malm | .............. | H01L 27/15 |
| | | | | 257/89 |
| 2015/0171050 A1* | 6/2015 | Chen | ................... | H01L 27/1464 |
| | | | | 257/784 |
| 2015/0362165 A1 | 12/2015 | Chu et al. | | |
| 2016/0027765 A1 | 1/2016 | Von Malm et al. | | |
| 2016/0247855 A1 | 8/2016 | Von Malm | | |
| 2017/0005000 A1* | 1/2017 | Beyne | ............... | H01L 21/76844 |

FOREIGN PATENT DOCUMENTS

| | | |
|---|---|---|
| WO | WO 2011/000898 A1 | 1/2011 |
| WO | WO 2016/015174 A1 | 2/2016 |
| WO | WO 2016/108021 A1 | 7/2016 |

OTHER PUBLICATIONS

Korean Office Action issued Nov. 27, 2020 in Korean Patent Application No. 10-2019-7007628 (with English translation), 11 pages.

European Office Action issued Jun. 5, 2020 in European Patent Application No. 17 761 815.4, 5 pages.

International Search Report issued Nov. 16, 2017 in PCT/EP2017/068936 filed Jul. 26, 2017.

\* cited by examiner

PROCESS FOR MOUNTING A MATRIX-ARRAY ELECTROLUMINESCENT COMPONENT ON A CARRIER

The invention relates to processes for assembling light components for use in light modules for motor vehicles on a substrate. In particular, the invention relates to the attachment of components comprising an arrangement of a plurality of electroluminescent semiconductor-based elementary sources, arranged in the form of a matrix, to a substrate.

The use of light-emitting diodes (LEDs), with their generally low power consumption, is increasingly recommended in the field of motor vehicles for fulfilling light functions such as daytime running lights, signalling lights, or for example turn indicator lights. An LED emits light when a load voltage having at least one predetermined value is applied across its terminals. The intensity of the light emitted by an LED is generally dependent on the intensity of the load current flowing therethrough.

In the field of light devices for motor vehicles, it is known practice to make use of modules involving a plurality of LEDs mounted in the form of a generally rectangular matrix. Each LED is an elementary light source that is advantageously current-driven individually and independently of the other LEDs in the matrix. Indeed, each LED may be considered to represent a pixel in a rectangular patch, the luminous intensity of which may be determined according to the needs of the target application. When all of the LEDs of such a module emit light uniformly, the module may be likened to a source forming a generally rectangular optical footprint. However, by supplying power selectively to the subsets of pixels, it becomes possible to create optical footprints of a variety of geometries. By way of example, such a configuration makes it possible to produce a headlamp that does not dazzle oncoming traffic, by selectively lowering the luminosity only of those pixels that illuminate the centre or left-hand side of the road, while still substantially illuminating the right-hand side of the road. More complex configurations are of course also envisageable using such devices.

To be able to make the most of the possibilities afforded by LED matrix technologies, sources with high pixel densities are increasingly required. This entails the distance between the elementary light sources, or LEDs, of the matrix-array source becoming ever smaller. What are referred to as "monolithic" light components may have a particularly high density of light sources, which makes them particularly advantageous for a number of applications. Such components involve a plurality of submillimetre-sized electroluminescent semiconductor elements, epitaxied directly on a common substrate, the substrate generally being formed of silicon. Unlike conventional LED matrices, in which each elementary light source is an individually produced electronic component mounted on a substrate such as a printed circuit board (PCB), a monolithic component is considered to be a single electronic component, in the production of which a plurality of electroluminescent semiconductor junction patches are formed on a common substrate, in the form of a matrix. This production technique allows electroluminescent patches, each acting as an elementary light source, to be formed very close to one another. The gaps between the elementary sources may be submillimetre-sized. One advantage of this production technique is the high level of pixel density that may be achieved on a single substrate.

To drive the electrical power supply of a monolithic matrix-array component of this type, and in particular to drive individual light elements of the matrix, it is necessary to provide electrical connections between the means for driving the power supply and each of the sources, resulting in a complex network of connections between the component and a carrier on which it is placed. These connections generally give rise to substantial bulk on the back surface of the monolithic component, forming the interface with the face of a carrier, which only increases as the elementary light sources get closer together. This surface must however also act as a heat exchange surface, and increasingly so as the high density of light sources on the component makes it a substantial heat source. It is known practice to fill the gaps between the electrical wiring of the monolithic matrix-array component with a filler material, typically a heat-conducting resin, in order to dissipate the heat thus produced towards the surface of the carrier. However, such known solutions entail additional steps (of adding filler material) during the assembly of the components on a carrier.

The aim of the invention is to overcome at least one of the problems posed by the prior art. In particular, one object of the invention is to provide a process allowing matrices of electroluminescent light sources with high pixel density to be produced without the resolution power of such a matrix being sacrificed. Another object of the invention is to provide a device resulting from such a process.

One subject of the invention is a process for mounting a light component on a carrier. The light component comprises a generally planar substrate, on a first face of which submillimetre-sized electroluminescent semiconductor elements are epitaxied in the form of a matrix. The method is noteworthy in that it comprises the following steps:
  forming at least one electrically conductive track on the second face of the substrate of the light component;
  forming at least one electrically conductive track on a face of the carrier;
  positioning the light component on said face of the carrier such that the electrically conductive tracks of the component and of the carrier make contact;
  annealing the assembly composed of the carrier and of the light component at a temperature of between 200° C. and 400° C.

Epitaxy is a technique for the oriented growth of crystals that is commonly used to form semiconductor junctions.

Preferably, the electrically conductive tracks formed on the second face of the substrate of the light component may be arranged so as to allow each of the electroluminescent semiconductor elements of the light component to be supplied with electric current.

The electrically conductive tracks may preferably be tracks that comprise copper. Advantageously, the tracks are made of copper.

The substrate of the light component may preferably comprise silicon, sapphire, silicon carbide or gallium nitride.

Preferably, the carrier may comprise silicon or glass.

The formation of copper-comprising tracks on the light component and on the substrate may preferably comprise the use of a photolithographic process to produce voids in the substrate and in the carrier. Preferably, copper may be deposited in the voids.

Preferably, the carrier and/or the light component may comprise alignment marks that are intended to facilitate the positioning of the component on the carrier.

Another subject of the invention is a light module for a motor vehicle. The light module is noteworthy in that it comprises means for driving the electrical power supply of a plurality of submillimetre-sized electroluminescent semiconductor elements that are epitaxied in the form of a matrix on a generally planar substrate of at least one light component, and in that said light component is mounted on a carrier using the process according to the invention.

The carrier may preferably be electrically connected to, or may comprise, on one of its faces, the means for driving the electrical power supply.

Preferably, the electrically conductive tracks formed on the carrier may be electrically connected to the means for driving the electrical power supply.

The measures according to the present invention allow known processes for mounting a monolithic matrix-array light component on a carrier to be simplified. The use of a copper-copper connection between the light component and its carrier makes it possible to avoid using a filler material, such as a heat-conducting resin, between the light component and the carrier. The copper-copper connection simultaneously provides the mechanical attachment between the electrical component and its carrier, the necessary electrical connections between each elementary electroluminescent light source of the monolithic matrix-array component and, moreover, good heat exchange between the component and its carrier, which only increases in importance as the high density of light sources on a monolithic matrix-array component makes it a non-negligible heat source.

Figure 2:
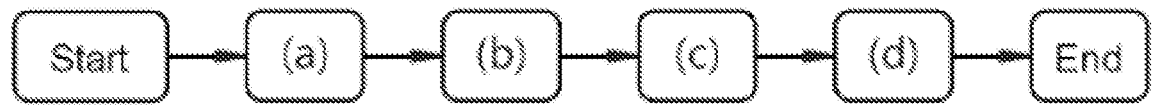
Figure 3:
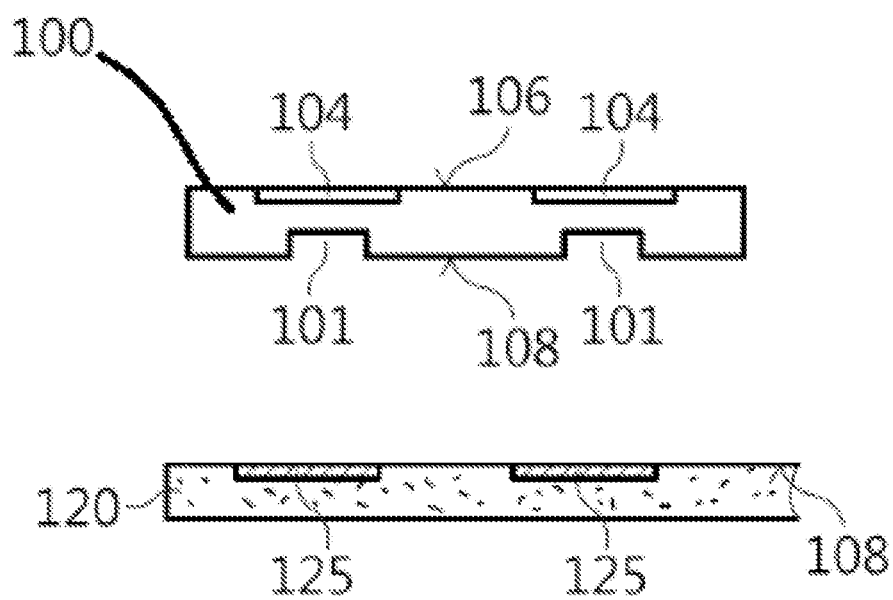
Figure 4:
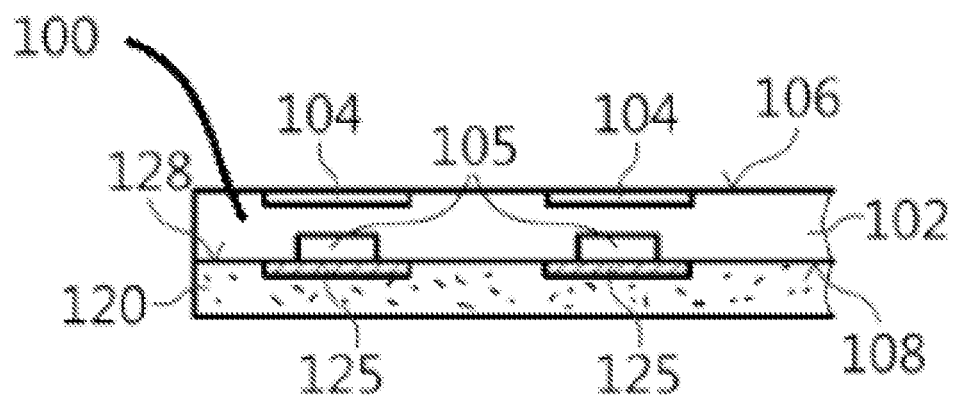

Other features and advantages of the present invention will be better understood with the aid of the exemplary description and the drawings, in which:

FIG. 1 schematically shows an assembly consisting of a matrix-array electroluminescent light component attached to a carrier according to a process known from the prior art;

FIG. 2 schematically shows the main steps according to a preferred embodiment of the process according to the invention;

FIG. 3 schematically shows a section through a matrix-array electroluminescent light component during the treatment according to one of the steps of the process according to the invention, as well as the carrier arranged next to the light component prior to joining into an assembly;

FIG. 4 schematically shows an assembly consisting of a matrix-array electroluminescent light component attached to a carrier according to a preferred embodiment of the process according to the invention.

Unless specified otherwise, technical features that are described in detail for one given embodiment may be combined with the technical features that are described in the context of other embodiments described by way of nonlimiting example.

FIG. 1 schematically shows a solution known from the prior art, according to which a light component 10 is attached to a generally planar carrier 20. The component 10 is what is referred to as a "monolithic" component comprising a substrate 12 on which submillimetre-sized elementary electroluminescent light sources 14 are epitaxied. Electrical connections, represented by wires 30, are provided between the component 10 and its carrier 20. These connections ensure that each of the elementary sources 14 of the matrix-array component 10 is supplied with power. The empty gap between the wires 30 is filled with a heat-conducting resin 32, which holds the component 10 securely to the carrier 20 and provides heat exchange between the component 10 and the carrier 20.

The main steps of a preferred embodiment of the process according to the invention are shown in FIG. 2. In a first step a), at least one electrically conductive track, comprising for example copper, is formed on the back face of the substrate of the matrix-array light component. This is the face which does not comprise the elementary light sources. Similarly, at least one electrically conductive track, comprising for example copper, is formed on a face of the carrier to which the matrix-array component is to be attached. This corresponds to step b). It goes without saying that the order of steps a) and b) may be inverted or that they may be carried out simultaneously in parallel, without however departing from the scope of the present invention. In the following step c), the light component and the carrier that have been prepared in this way are positioned such that the tracks comprising copper that were formed in the preceding steps make contact.

Other electrically conductive metals or materials may be used instead of copper as long as they exhibit similar properties, without however departing from the scope of the present invention.

Next, the assembly composed of the carrier and of the light component is annealed in an oven provided for this purpose at a temperature of between 200° C. and 400° C. This corresponds to the final step d). During the annealing operation, what is referred to as a "hybrid-bonding" connection is formed between the matrix-array component and its carrier. This component-carrier connection is electrically and thermally conductive, and at the same time provides high mechanical strength of hold between the matrix-array component and the carrier. The process requires neither the use of adhesive nor the application of pressure to the components during assembly on the carrier and forms a direct connection without producing a void between the component and the carrier.

FIG. 3 provides an illustration of an electroluminescent component 100 in step a) of the process, and the carrier 120 in step b) of the process, which were described above. The component 100 comprises a first face 106 on which the electroluminescent sources 104 are epitaxied in the form of a matrix. Voids 101 are formed on a second face 108, which is located on the back side of the first face 106. The substrate 106 preferably comprises silicon, GaN, sapphire or silicon carbide. The voids are designed so as to correspond to the network of electrical connections that are required to supply each of the elementary sources 104 with power. To achieve this, photolithographic processes that are known per se in the prior art, and will not be described in detail within the context of the present invention, may be used. Once the voids have been formed, copper is deposited at the bottom of the voids, so as to fill them. An optional polishing step may be envisaged so as to provide a generally smooth interface between the voids 101 thus filled and the surface 108. A similar process is used to form the copper-containing tracks on the surface of the carrier. The electroluminescent component 100 and the carrier 120 are shown adjacent to one another prior to joining together as an assembly.

FIG. 4 shows the result of the process according to the invention. The component 100 comprises a first face 106 on which the electroluminescent sources 104 are epitaxied in the form of a matrix. On a second face 108, voids form a network of ribs in the image of the required electrical connections. The ribs or voids are filled with copper 105. The carrier 128, comprising silicon or glass, has, on its face 128, copper tracks 125 which correspond to the tracks 105 on the back face 108 of the component 100. During the operation of annealing the assembly formed by the component 100 and the carrier 120, the required hybrid-bonding connection is formed at the site of the lands 105 and 125, respectively.

In a preferred embodiment, the electrically conductive tracks 125 are functionally connected to means for driving the power supply of the light sources 104. Such means are known in the art and generally entail converter elements that are configured to transform a direct current of a first intensity, supplied in general by a current source internal to the motor vehicle in which the component 100 is used, into a load current of a second intensity, suitable for selectively supplying power to the light sources 104 of the component 100. A light module for a motor vehicle may advantageously also comprise control means produced in the form of a microcontroller element, which means allow the means for driving the power supply to be controlled so as to meet setpoints received from other members of the motor vehicle.

The invention claimed is:

1. Process for mounting a light component on a carrier, comprising:
   providing a light component which comprises a generally planar substrate having a first face on which a matrix-array of submillimetre-sized electroluminescent semiconductor elements are epitaxied and spatially isolated from one another in the form of a matrix;
   forming at least one first electrically conductive track which comprises copper on a second face of the planar substrate of the light component which is opposite to the first face having the matrix array of submillimetre-sized electroluminescent semiconductor elements thereon;
   providing a carrier;
   forming at least one second electrically conductive track which comprises copper on a face of the carrier;
   forming an assembly composed of the carrier and the light component by positioning the second face of the light component on said face of the carrier such that each of the first electrically conductive tracks of the light component makes contact with a respective one of the second electrically conductive tracks of the carrier;
   annealing the assembly composed of the carrier and the light component at a temperature of between 200° C. and 400° C. to form a hybrid bonding connection which includes a copper-copper connection at each contact site of the first and second electrically conductive tracks, said copper-copper connection providing mechanical attachment and heat exchange between the light component and the carrier.

2. Process according to claim 1, wherein the first electrically conductive tracks formed on the second face of the substrate of the light component are arranged so as to allow each of the electroluminescent semiconductor elements of the light component to be supplied with electric current.

3. Process according to claim 1, wherein the substrate of the light component comprises silicon, sapphire, silicon carbide or gallium nitride.

4. Process according to claim 1, wherein the carrier comprises silicon or glass.

5. Process according to claim 1, wherein the formation of the first and second electrically conductive tracks on the light component and on the substrate comprises the use of a photolithographic process to produce voids in the substrate and in the carrier.

6. Process according to claim 5, wherein copper is deposited in each of the voids.

7. Process according to claim 1, wherein the carrier and the light component comprise alignment marks that are intended to facilitate the positioning of the component on the carrier.

8. Process according to claim 2, wherein the carrier and the light component comprise alignment marks that are intended to facilitate the positioning of the component on the carrier.

9. Process according to claim 2, wherein the substrate of the light component comprises silicon, sapphire, silicon carbide or gallium nitride.

10. Process according to claim 2, wherein the carrier comprises silicon or glass.

11. Process according to claim 1, wherein:
    the first electrically conductive track is a first copper track,
    the second electrically conductive track is a second copper track, and
    the first copper track directly contacts the second copper track such that the hybrid bonding connection comprises a copper-to-copper connection between the light component and the carrier.

12. Process according to claim 1, wherein the light component is a monolithic light component.

13. Process according to claim 1, wherein the forming an assembly comprises positioning the light component on said face of the carrier without providing an adhesive or filler material between the light component and the face of the carrier.

14. Process according to claim 1, wherein the hybrid bonding connection is formed without providing pressure to connect the light component and the carrier.

* * * * *